(12) United States Patent
Chabineau-Lovgren et al.

(10) Patent No.: US 8,324,919 B2
(45) Date of Patent: Dec. 4, 2012

(54) SCRUB INDUCING COMPLIANT ELECTRICAL CONTACT

(75) Inventors: Scott Chabineau-Lovgren, Pomona, CA (US); Steve B. Sargeant, Anaheim Hills, CA (US); Mark A. Swart, Villa Park, CA (US)

(73) Assignee: Delaware Capital Formation, Inc., Wilmington, DE (US)

( * ) Notice: Subject to any disclaimer, the term of this patent is extended or adjusted under 35 U.S.C. 154(b) by 5 days.

(21) Appl. No.: 12/629,790

(22) Filed: Dec. 2, 2009

(65) Prior Publication Data

US 2010/0244875 A1 Sep. 30, 2010

Related U.S. Application Data

(60) Provisional application No. 61/164,065, filed on Mar. 27, 2009.

(51) Int. Cl.
*G01R 31/00* (2006.01)
(52) U.S. Cl. ......... 324/755.11; 324/755.05; 324/754.03; 324/756.04
(58) Field of Classification Search . 324/755.01–755.11, 754.03, 756.03–756.04; 439/66
See application file for complete search history.

(56) References Cited

U.S. PATENT DOCUMENTS

| 3,458,851 | A | | 7/1969 | Webb | |
|---|---|---|---|---|---|
| 4,199,209 | A | * | 4/1980 | Cherian et al. | 439/591 |
| 4,560,223 | A | * | 12/1985 | Cooney et al. | 439/387 |
| 6,464,511 | B1 | * | 10/2002 | Watanabe et al. | 439/66 |
| 6,758,682 | B1 | * | 7/2004 | Kosmala | 439/66 |
| 6,902,410 | B2 | * | 6/2005 | Watanabe | 439/66 |
| 6,945,827 | B2 | | 9/2005 | Grube et al. | |
| 7,025,602 | B1 | * | 4/2006 | Hwang | 439/66 |
| 7,102,373 | B2 | * | 9/2006 | Yoshida | 324/755 |
| 7,458,818 | B2 | * | 12/2008 | Kiyofuji et al. | 439/66 |
| 2001/0039128 | A1 | * | 11/2001 | Tateishi et al. | 439/71 |
| 2002/0024347 | A1 | * | 2/2002 | Felici et al. | 324/754 |
| 2008/0001613 | A1 | * | 1/2008 | Kister | 324/754 |
| 2008/0204061 | A1 | * | 8/2008 | Chartarifsky et al. | 324/761 |
| 2009/0111289 | A1 | * | 4/2009 | Vinther | 439/66 |
| 2012/0129408 | A1 | * | 5/2012 | Kimura et al. | 439/817 |

OTHER PUBLICATIONS

International Search Report and Written Opinion for International Application No. PCT/US2010/028727, mailed May 26, 2010, 6 pages.

* cited by examiner

*Primary Examiner* — Arleen M Vazquez
(74) *Attorney, Agent, or Firm* — Christie, Parker & Hale, LLP

(57) ABSTRACT

The contact assembly having a contact member with a contact tip positioned within holes in a test socket or probe plate wherein the contact tip or the hole in the probe plate or test socket has a cam surface to provide lateral movement of the contact tip across a surface of a test location during compression of the contact member to induce scrubbing on the surface of the test site.

15 Claims, 7 Drawing Sheets

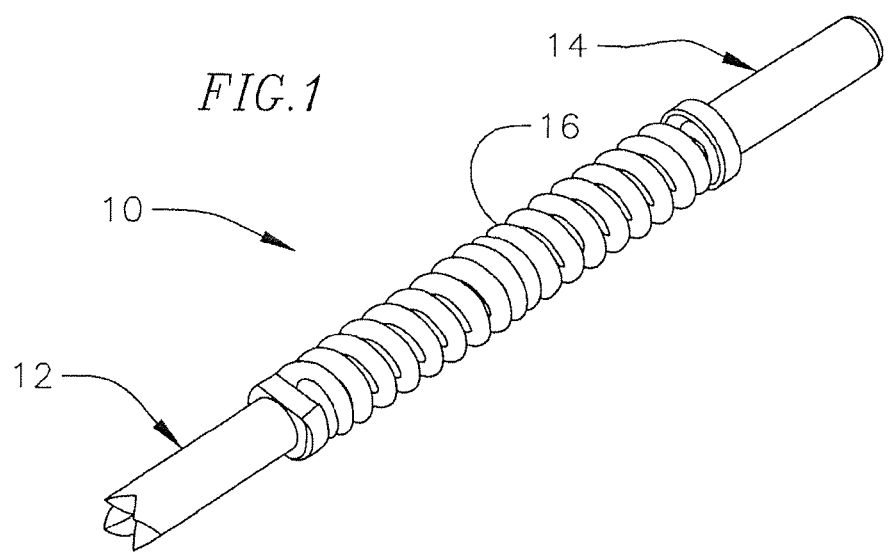
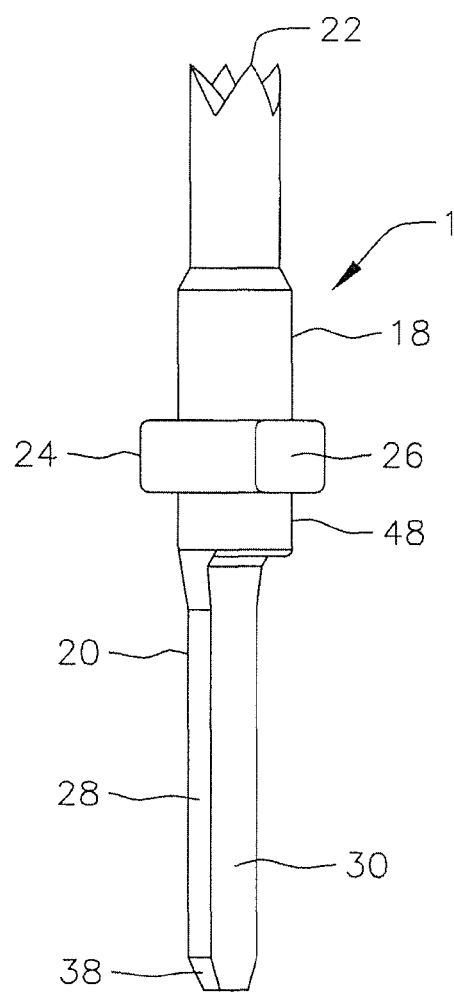
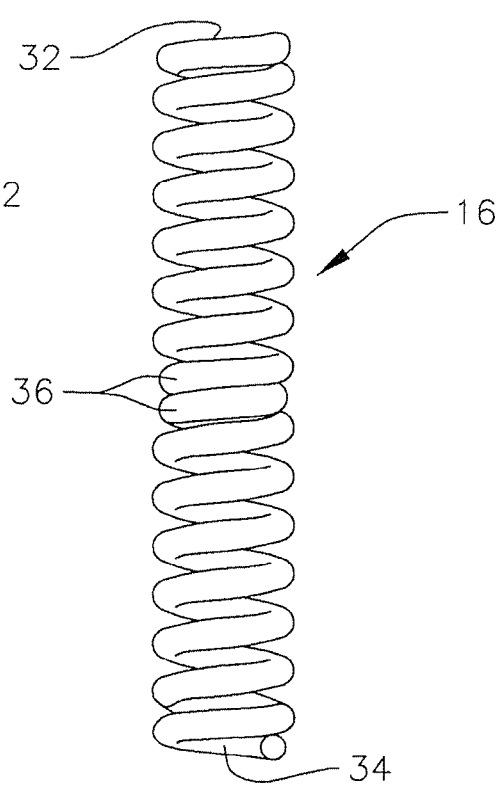

US 8,324,919 B2

SCRUB INDUCING COMPLIANT ELECTRICAL CONTACT

CROSS-REFERENCE TO RELATED APPLICATION(S)

This application claims priority to U.S. Provisional Application Nos. 61/164,065 filed Mar. 27, 2009.

FIELD OF THE INVENTION

The present invention relates to electrical contact probes forming electrical interconnects and, more particularly, to contact probes having a scrub inducing contact tip.

BACKGROUND OF THE INVENTION

Conventional spring loaded contact probes generally include a movable plunger and a barrel having an open end for containing an enlarged diameter section of the plunger, and a spring for biasing the travel of the plunger in the barrel. The plunger bearing slidably engages the inner surface of the barrel. The enlarged bearing section is retained in the barrel by a crimp near the barrel open end. The plunger is commonly biased outwardly, a selected distance by the spring and may be biased or depressed inwardly into the barrel, a selected distance, under force directed against the spring. Axial and side biasing of the plunger against the barrel prevents false opens or intermittent points of no contact between the plunger and the barrel. The plunger generally is solid and includes a head or tip for contacting electrical devices under test. The barrel may also include a tip opposite the barrel's open end.

The barrel, plunger and tips form an electrical interconnect between the electrical device under test and test equipment and as such, are manufactured from an electrically conductive material. Typically the probes are fitted into cavities formed through the thickness of a test plate or socket. Generally a contact side of the electrical device to be tested, such as an integrated circuit, is brought into pressure contact with the tips of the plungers protruding through one side of the test plate or test socket for manufacturing spring pressure against the electrical device. A contact plate connected to the test equipment is brought to contact with the tips of the plungers protruding from the other side of the test plate or test socket. The test equipment transmits signals to the contact plate from where they are transmitted through the test probe interconnects to the device being tested. After the electrical device has been tested, the pressure exerted by the spring probes is released and the device is removed from contact with the tip of each probe.

The process of making conventional spring probes involves separately producing the compression spring, the barrel and the plunger. The compression spring is wound and heat treated to produce a spring of a precise size and of a controlled spring force. The plunger is typically turned on a lathe and heat treated. The barrels are also sometimes heat treated. The barrels can be formed in a lathe or by a deep draw process. All components may be subjected to a plating process to enhance conductivity. The spring probe components are assembled either manually or by an automated process.

An important aspect of testing integrated circuits is that they are tested under high frequencies. As such impedance matching is required between the test equipment and the integrated circuit so as to avoid attenuation of the high frequency signals. Considering that spacing within a test socket is minimal, in order to avoid attenuation of the high frequency signals, the length of the electrical interconnect formed by the probes must be kept to a minimum. To address this problem external spring probes have been developed having a shorter length than conventional probes. External spring probes consist of two separate sections each having a tip and a flange. A contact component extends from each probe section opposite the tip. The two contact components contact each other and the spring is sandwiched between two flanges that surround the contact components. Typically the first contact component is a barrel while the second contact component is a bearing surface. The bearing surface is slidably engaged to the inner surface of the barrel. These probes are fitted into cavities formed in the test sockets used during testing. A problem associated with these type of external spring probes is the expense to manufacture due to costly machining operations.

In response thereto external spring probes were designed having flat components which can be produced less expensively by stamping. Typically these designs incorporate two components which are connected orthogonally and the electrical path between the two components is through a protruding end surface. A problem with this design is that the components wear out rather quickly and have a short life span requiring constant replacement.

Non-orthogonally connected external spring contact assemblies have two movable and linearly overlapping contact members or plungers surrounded by an external spring. Each plunger has a contact portion and a tail portion wherein the tail portion has a flat surface that passes over and makes contact with an opposing flat plunger tail portion inside the spring when assembled. The spring has end coils that press onto each of the opposing plungers to prevent the plungers from separating from the spring, thus fixing the plunger contact portion and the tail portions with respect to each end of the spring. Utilizing the natural torsional movement of the spring while it is compressed, the flat surfaces of the plunger tail portions maintain contact throughout the compression stroke of the contact assembly. The contact between the opposing flat sections prevents the twisting or torsional movement of the spring from translating to the tips on the contact portions. The opposition to the natural twisting enhances the electrical conductivity of the components, which in turn improves performance of the spring contact assembly. The spring can also have reduced diameter coil sections along the length of the spring to further constrain the plunger tails and enhance the interaction between the two plungers, or further biasing effect can be created by adding an offset coil section in the spring.

Each of the plungers formed in a generally cylindrical shape are by lathe, screw machine or other similar manufacturing equipment. Plungers formed in a generally flat shape are by stamping, etching, photolithography or other similar manufacturing technique for creating substantially two dimensional geometries.

A problem with obtaining a good test signal occurs when the test location is dirty or contaminated by excess solder, flux or oxides. When these contaminants are present a reliable connection between the test site and the contact tip of the test contact cannot be assured. Consequently, a need exists for compliant electrical test contacts having a contact tip which assures a connection with contaminated test locations.

SUMMARY OF THE INVENTION

The present invention is directed to a spring contact assembly having two movable contact members or plungers and a compression spring wherein the contact members have a compliant contact tip that induces scrub upon being compressed against a test surface. Each plunger has a contact portion and a tail portion wherein the tail portion can have a flat surface that passes over and makes contact with an opposing plunger tail portion inside the spring assembly. The spring has end coils that press on to each of the opposing plungers to prevent the plungers from separating from the spring.

Each of the plungers may also be formed in a general cylindrical shape suitable for lathe, screw machine or other similar manufacturing equipment. The plunger may also be formed in a generally flat shape, suitable for stamping, etching, photolithography or other similar manufacturing technique for creating substantially two-dimensional geometries. The scrub inducing contact tip can be incorporated into a flat plunger, round plunger or compliant plunger configurations without a compression spring. The contact tip induces scrubbing by incorporating an angled camming surface on a side of the plunger or tip to create a lateral wiping movement across the test site during compression. The angled camming surface alternatively can be formed in the socket or test plate.

These and other aspects of the present invention will be more fully understood with reference to the detailed description in combination with the drawings.

BRIEF DESCRIPTION OF THE DRAWINGS

FIG. 1 is a perspective view of a spring contact assembly of the present invention;

FIG. 2 is a side view of a first plunger of the spring contact assembly of FIG. 1;

FIG. 3 is a side view of a spring of the spring contact assembly of FIG. 1;

DETAILED DESCRIPTION OF THE INVENTION

Figure 4:
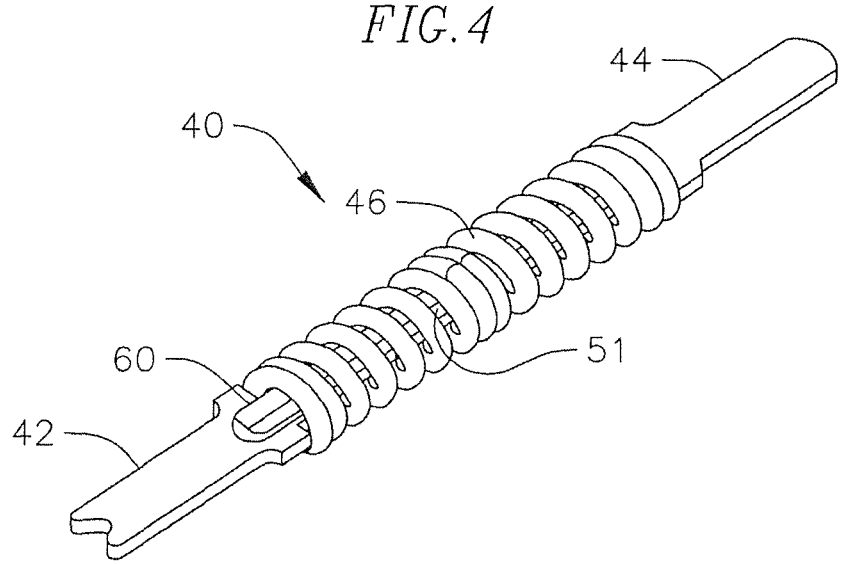
FIG. 4 is a perspective of an alternative embodiment spring contact assembly of the present invention.

FIGS. 1-3 illustrate an exemplary spring contact assembly 10 of the present invention. The spring contact assembly 10 includes a first contact member or round plunger 12, a second contact member or round plunger 14, and a spring 16. As shown in FIG. 2, plunger 12 includes a contact portion 18 and a tail portion 20. A conventional contact tip 22 is positioned at an end of the contact portion 18 and can have multiple contact geometries. A flange 24 is positioned between contact portion or section 18 and tail portion or section 20. Flange 24 has a flat face 26 used for aligning the probe during assembly. The plunger tail portion 20 has a cylindrical surface 28 and a flat surface 30 extending along its length.

Plunger 14 also includes a contact portion and a tail portion. A flange is positioned between contact section and tail section and also includes a flat surface for positioning plunger 14 during assembly. Tail section has a cylindrical surface and a flat surface extending along its length. Flat surfaces pass over one another and make contact inside of spring 16 when assembled. Flat surfaces increasingly engage one another during compression of the assembly.

As shown in FIG. 3 the spring 16 has end coils 32 and 34 at opposite ends of the spring that press onto the plunger tail sections at the cylindrical sections adjacent the flanges. The end coils 32 and 34 may have a slightly smaller diameter and therefore firmly grip the cylindrical sections to prevent the plungers from separating from the spring. Utilizing the natural torsional movement of the spring 16 while it is compressed, the flat portions of the plungers maintain contact throughout the entire stroke of the probe. The contact between the opposing flat sections prevents twisting or torsional movement from translating it to the spring contact tips. The opposition to the natural twisting enhances the electrical conductivity of the components, which in turn improves the performance of the contact. To further constrain the tail sections and enhance the interaction between the two plungers, the spring 16 can employ reduced coil sections 36.

The tail section may have a reduced end section 38 that allows the spring to be threaded onto the tail portion before being press fit on the reduced diameter section adjacent the flange. The reduced section 38 allows the plunger to pilot into the spring, easing the assembly process. As previously indicated, the cylindrical sections of the plunger tails creates an interference fit with the end coils of the spring and the gripping force created between the cylindrical sections and the end coils is sufficient to keep the assembly together during normal handling and use and in combination with the flat surfaces resist normal torsional forces applied by the spring. The generally cylindrical plunger designs of FIGS. 1 and 2 are manufactured by machining such as a lathe, screw machine or other similar manufacturing equipment. The contact assembly 10 is illustrated as an external spring configuration however it is to be understood that the inventive concepts of the present invention are equally applicable to internal spring configurations having a barrel and a plunger.

Figure 5:
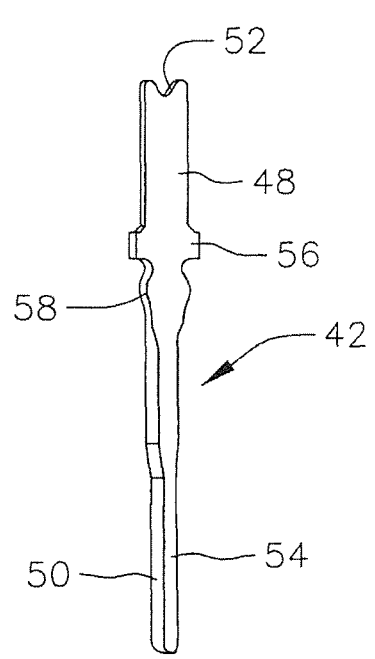
FIG. 5 is a side view of one plunger of the spring contact assembly of FIG. 4.
Figure 6:
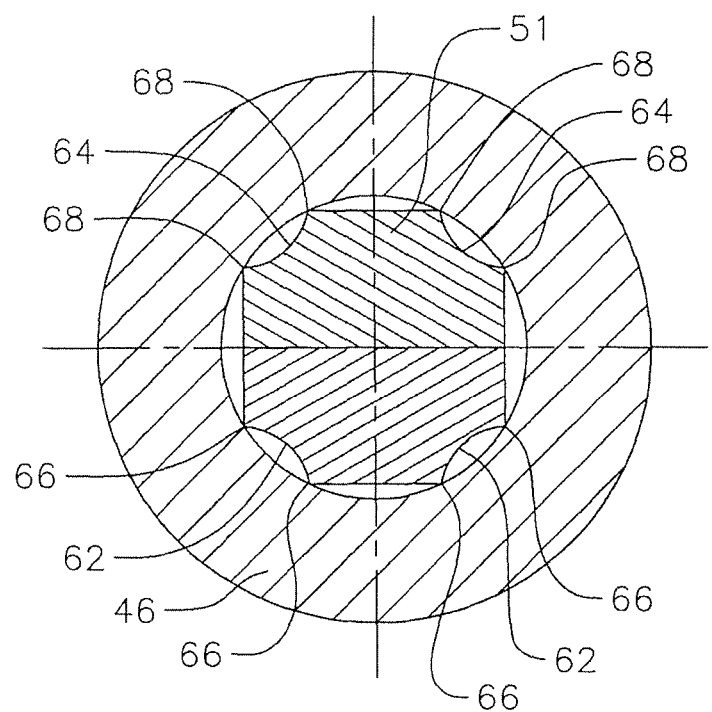
FIG. 6 is a cross-sectional view of the assembly of FIG. 4.

An alternative spring contact assembly 40 is illustrated in FIGS. 4-6. Spring contact assembly 40 includes two movable and overlapping plungers 42 and 44 surrounded by an external spring 46. Plungers 42 and 44 are formed in a generally flat shape, suitable for stamping, etching, photolithography or other similar manufacturing technique for creating substantially two-dimensional geometries.

Plunger 42 includes a contact portion or section 48 and a tail portion or section 50. Contact section 48 includes a contact tip 52 which can be any of a number of geometrical configurations. Considering the entire plunger has a flat configuration, plunger tail section 50 includes a flat surface 54. A flange 56 is positioned between contact section 48 and tail section 50. Tail section 50 includes an enlarged portion 58 for creating an interference fit with end coils of the spring 46 to retain the spring contact in its assembled configuration. Mating plunger 44 also includes a contact portion, a tail portion 51, and a flange positioned between the contact section and tail section. Tail section includes an enlarged portion for creating an interference fit with the end coils of spring 46.

In the flat configuration spring contact assembly 40, the plunger tail sections may have an end portion 60 that extends past the end coils of the spring as shown in FIG. 4. This design enhances the electrical contact between the plungers and adds support to the opposite plunger tip. One or both of the plunger tails can extend beyond the end coils for a particular application. As shown in FIG. 6, tail portions 50 and 51 have coves 62 and 64 along the edge of the outer surface which form cornices or points 66 and 68. In high performance testing applications where the spring contact assembly is susceptible to resonance caused by the spring coils under high frequency, intimate contact force is increased between plungers 42 and 44 and spring 46 by swaging the cornices or points 66 and 68 during initial assembly by the coils of spring 46. The swaging can be accomplished by reduced diameter end coils or center coil sections of the spring. The plungers are designed to have a slight interference fit upon assembly and the initial swaging of the spring over the plungers or barrel deforms interference features such as the cornices or points to produce a custom fit of the spring and the plungers or a barrel in applications including a barrel. As the compliant contacts are compressed for the first time, the interference between the spring deforms the edges forming a custom and location or clearance fit.

For cylindrical spring probes as shown in FIG. 1 the tail portion diameter is reduced to form a flat surface having edges that are swaged by the spring coils. For etched components as shown in FIG. 4, the cove 62 creates the edge points which are thin and unsupported and are ideal for swaging. Stamped or electroformed components are formed having sharp corners for the swaging process.

Figure 7:
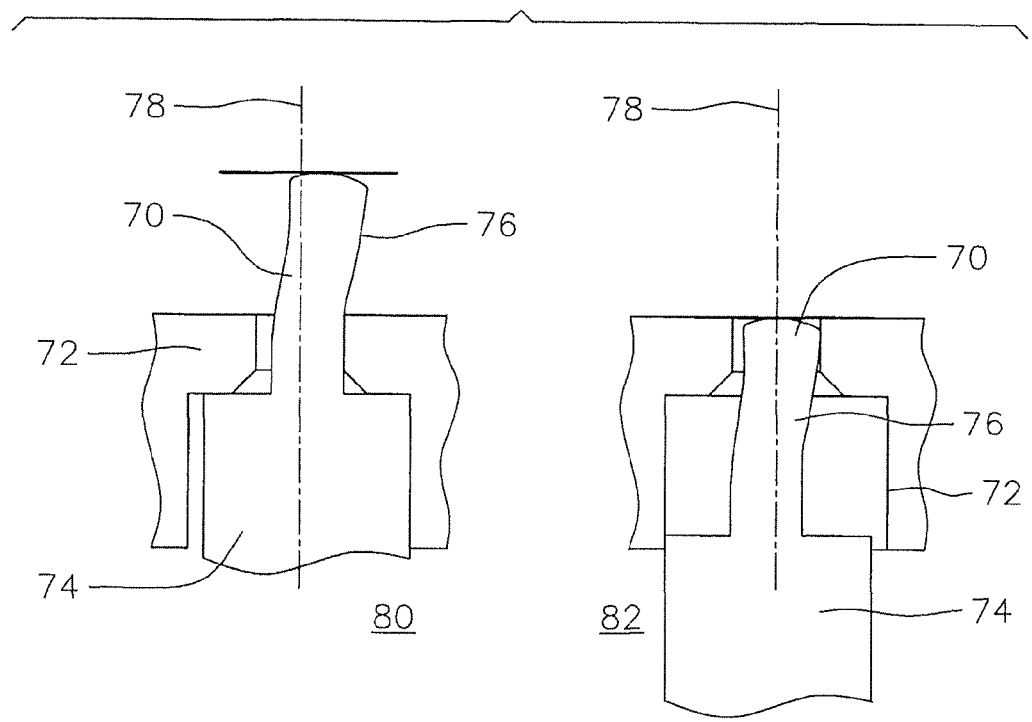
FIG. 7 is a detail view of a contact tip of the spring contact assembly of either FIG. 1 or FIG. 4.

FIG. 7 illustrates a first embodiment scrub inducing compliant contact tip of the present invention. FIG. 7 is a detail view illustrating a contact tip 70 positioned within a test socket or probe plate 72. Plunger 74 is positioned within a cavity or hole in the test socket or probe plate 72 such that the contact tip 70 exits out of a smaller diameter opening in the test socket or probe plate. The contact tip 70 includes a angled cam surface 76 which causes lateral movement of contact tip 70 during compression. The lateral movement induces scrub upon the test contact surface which could be a printed circuit board test site, a solder ball, an electronic package interconnect point or a device under test depending upon the particular application. This scrubbing, also known as wiping, breaks through contaminants such as oxides, solder, or flux and assures good electrical contact with the test location. FIG. 7 illustrates the position of the contact tip 76 with respect to the center line 78 of placement within the test socket or probe plate and further illustrates the lateral movement of the contact tip from a first position 80 in an uncompressed state to a second position 82 in its compressed state.

Figure 8:
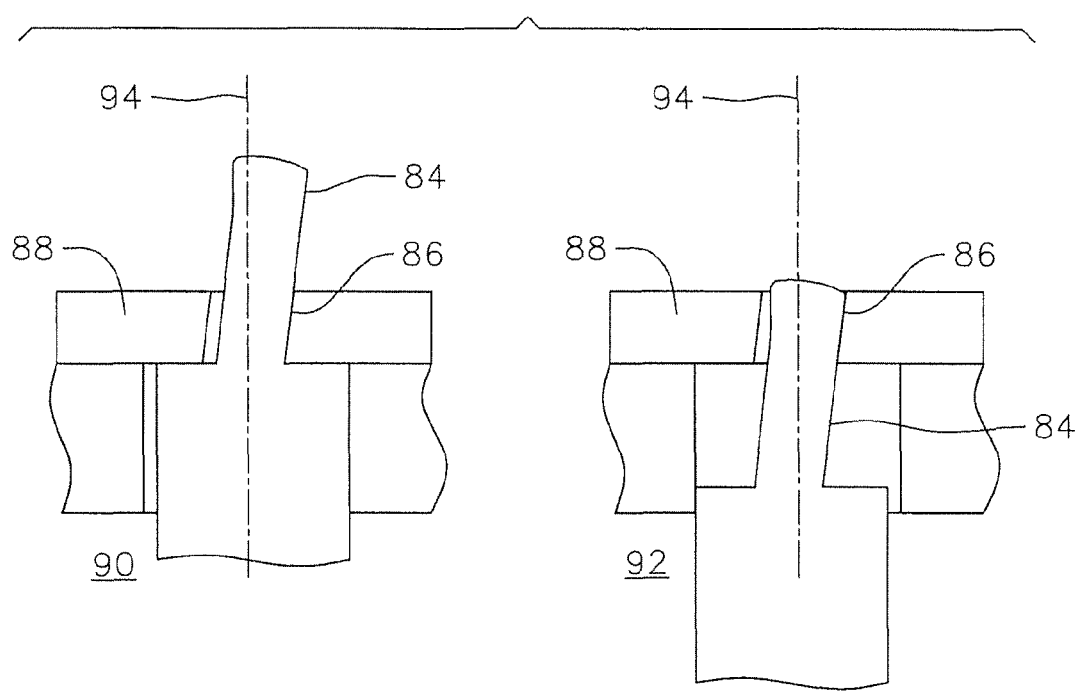
FIG. 8 is a detail view of an alternative contact tip design.

FIG. 8 illustrates an alternative contact tip configuration wherein the tip 84 is positioned within an angled hole 86 in the test socket or probe plate 88. Contact tip 84 moves laterally from a first position 90 in an uncompressed state to a second position 92 in a compressed state with respect to center line 94.

Figure 9:
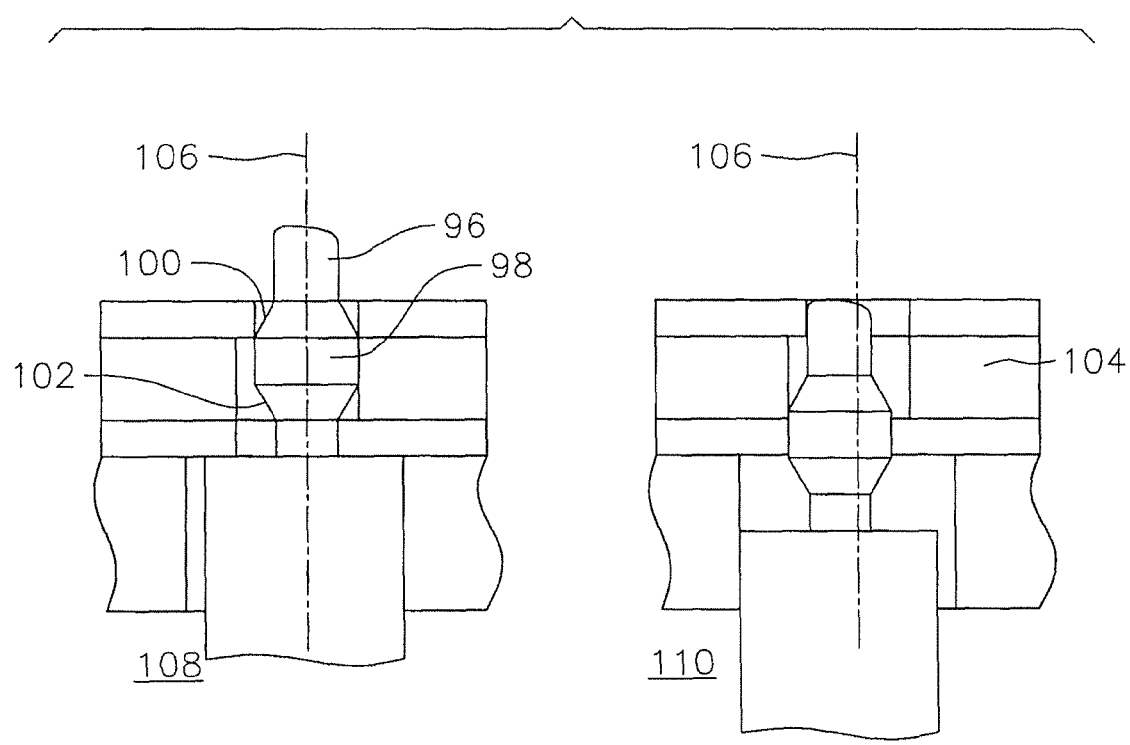
FIG. 9 is a detail view of another alternative contact tip design.

FIG. 9 illustrates another embodiment contact tip configuration wherein contact tip 96 has a larger diameter center portion 98 and angled camming surfaces 100 and 102 which provide lateral or scrubbing movement within the test module or probe plates 104. The test module or probe plate can have a plurality of plates with staggered holes wherein the angled camming surfaces 100 and 102 move the tip laterally during compression by riding against the staggered holes within the probe plate. Scrubbing or lateral movement occurs with respect to the center line 106 from a first position 108 in an uncompressed state to a second position 110 in a compressed state.

Figure 10:
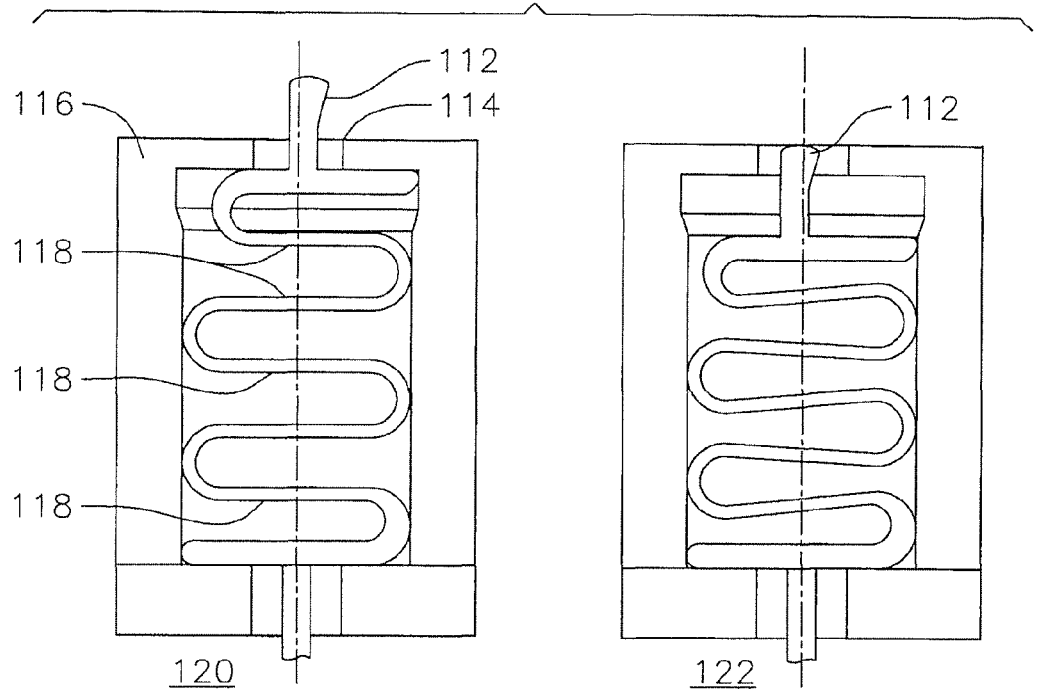
FIG. 10 is a detail view of another alternative contact tip design.
Figure 11:
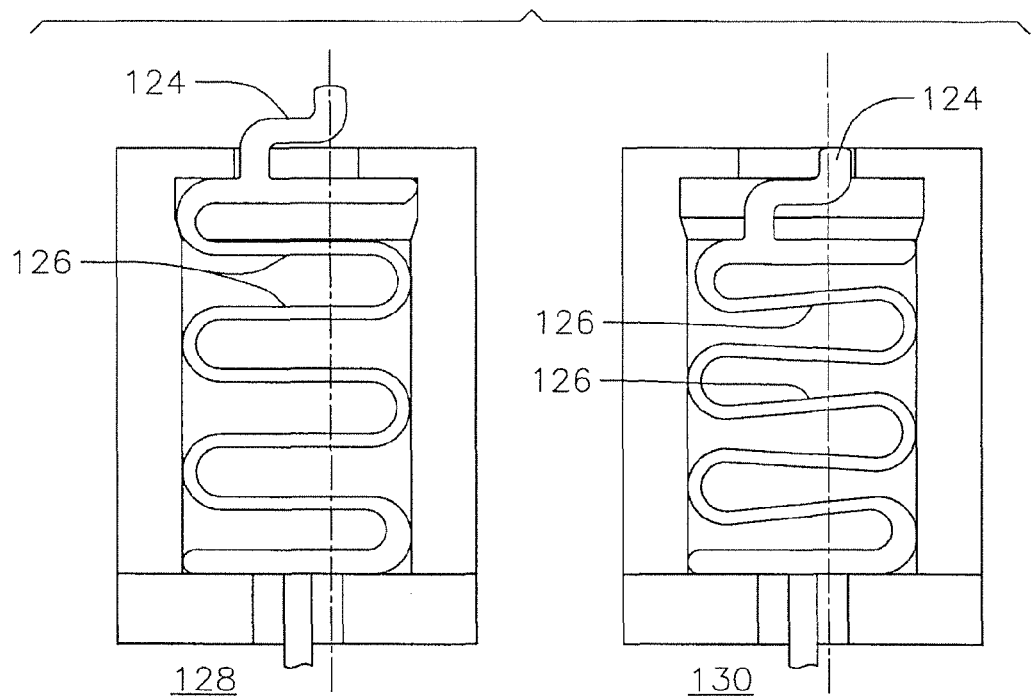
FIG. 11 is a detail view of another alternative contact tip design.

FIG. 10 illustrates another compliant contact tip design incorporated into a test probe having a plurality of serpentine deflection beams. Contact tip 112 extends through a hole 114 in the test module or probe plate 116 and is integrally formed with a plurality of serpentine shaped beams 118 positioned within the test module or probe plate. Lateral or scrubbing movement occurs during compression of the contact tip and the deflection of the beams 118 from an uncompressed state 120 to a compressed state 122. FIG. 11 illustrates a cantilevered contact tip 124 attached to cantilevered beams 126 similar to FIG. 10 which provides lateral movement or scrubbing from an uncompressed state 128 to a compressed state 130.

Figure 12:
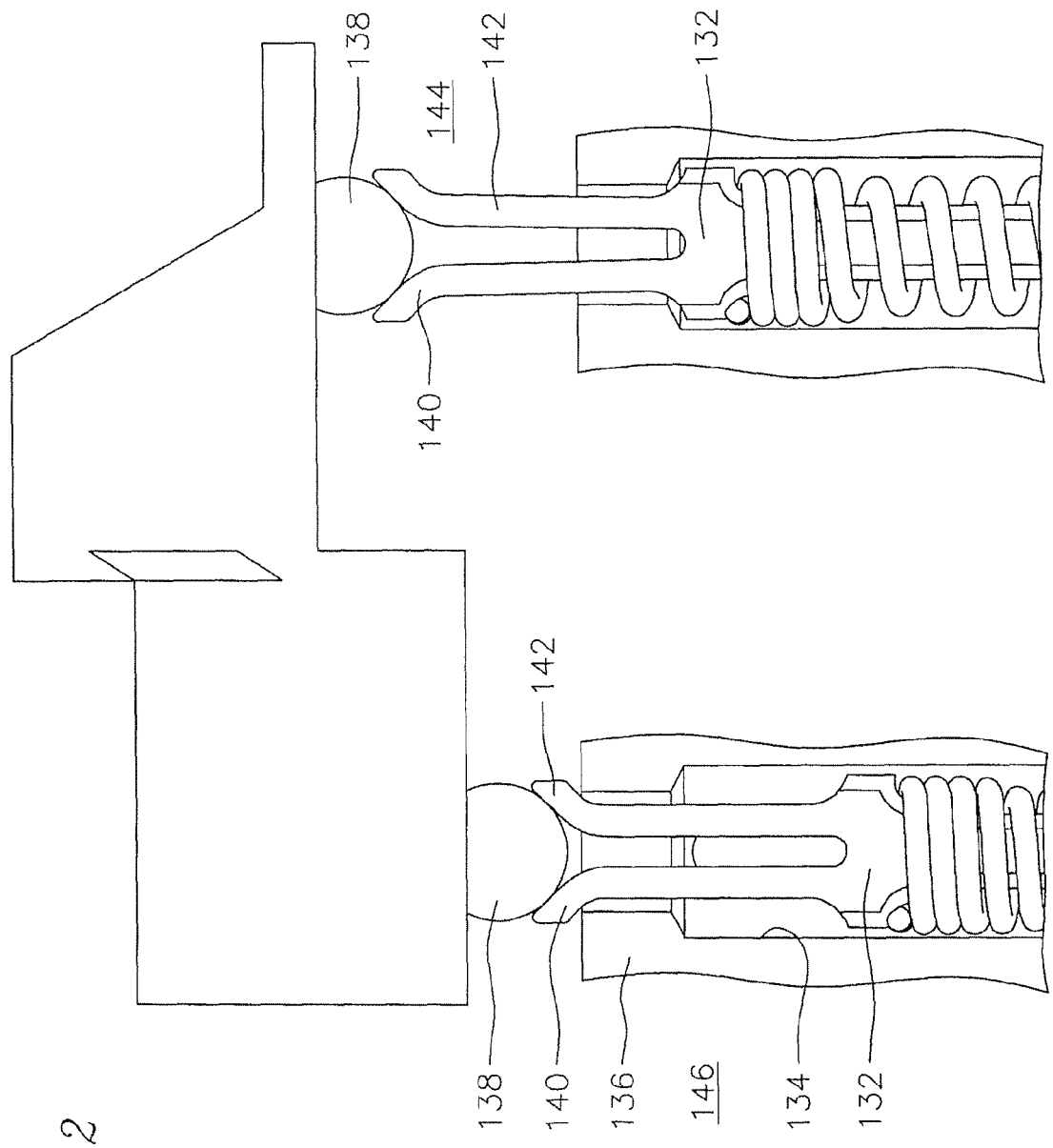
FIG. 12 is a detail view of another alternative contact tip design.

FIG. 12 illustrates yet another alternative contact tip design specifically applicable to ball grid array (BGA) or solder ball test site locations. The contact tip 132 extends from a hole 134 in the test socket or probe plate 136 to make contact with solder ball 138. The contact tip has separate prongs or fingers 140 and 142 which make contact with either side surface of the solder ball 138. The wiping or lateral movement of the prongs or fingers along the sides of the solder ball 138 occur from an uncompressed state 144 to a compressed state 146. The fingers or prongs provide a symmetrical load on the solder ball which cancel one another during compression. The wiping action or spreading of the fingers breaks through the contaminants to provide good electrical connection.

Figure 13:
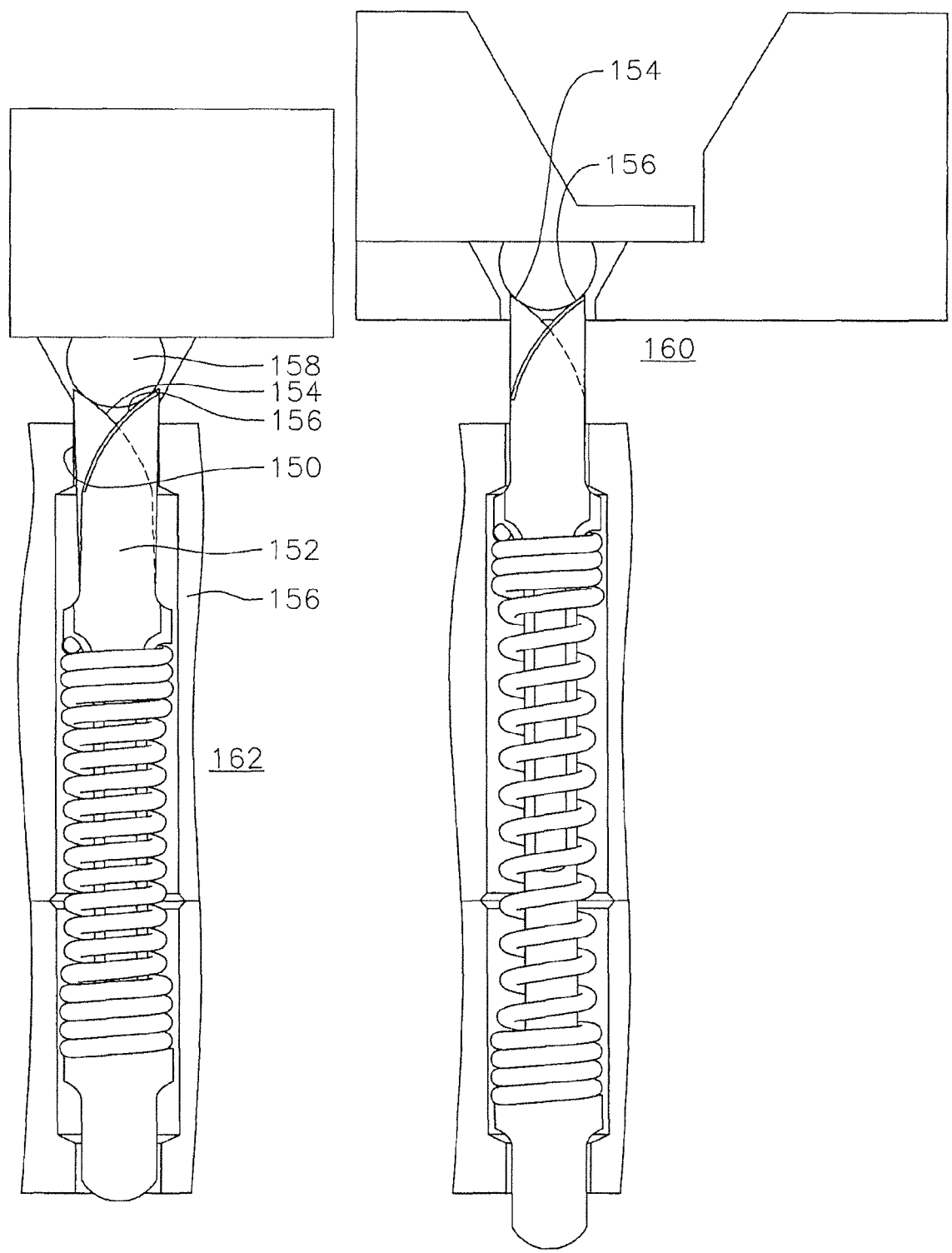
FIG. 13 is a detail view of another alternative contact tip design.

FIG. 13 illustrates yet another contact tip design. In this embodiment two flat configured plungers 150 and 152 are aligned one on top of each other having contact tips with opposing angled cam surfaces 154 and 56 respectively. Both plungers 152 and 154 are retained within a hole and the test socket or probe plate 156 such that the tips extend outwardly to contact the side surfaces of the solder ball 158. During compression of plungers the contact tips 150 and 152 provide the scrubbing force along opposite sides of the solder ball 158 from an uncompressed state 160 to a compressed state 162. Similar to FIG. 13, the opposing angled cam surfaces present symmetrical load on the solder ball which cancel one another.

The angled cam surfaces for the contact tips are formed on the plungers during the manufacturing process. For flat plunger configurations, the cam surface can be etched during manufacturing and for round probes, the cam surface is formed by bending the end of the plunger. Alternatively, as indicated above, the cam surface can be a part of the test socket or probe plate by having an angled surface drilled into the probe plate or molded into the test socket.

Although the present invention has been described and illustrated with respect to several embodiments thereof it is to be understood that changes and modifications can be made therein which are within the full scope of the invention as hereinafter claimed.

What is claimed is:

1. A compliant contact assembly having a flat configuration comprising:
   a flat contact member having a contact tip;
   means for allowing compression of the contact member; and
   a cam surface along an outer side surface of the contact tip for inducing scrubbing of an end portion of the contact tip with a test site during compression of the contact assembly by a lateral movement of the contact member, wherein the cam surface does not engage the test site during compression of the contact assembly.

2. The assembly of claim 1 wherein the means for allowing compression is a compression spring adjacent the contact member.

3. The assembly of claim 1 wherein the means for allowing compression is a plurality of serpentine beams attached to the contact tip.

4. A compliant contact assembly having a flat configuration comprising:
   a fiat contact member having a contact tip and; and
   means for allowing compression of the contact member;

wherein the contact tip has two fingers each having a contact surface having an etched cove along an edge portion forming a blade for inducing scrubbing of a test site during compression of the contact tip onto the test site by the blade cutting into contaminants on the test site.

5. The contact assembly of claim 4 wherein the contact assembly is positioned in a hole in a test socket or probe plate.

6. A compliant contact assembly having a flat configuration comprising:
- a first flat contact member having a contact tip;
- a second flat contact member having a contact tip, wherein the first flat contact member is aligned on top of the second flat contact member; and
- means for allowing compression of the first flat contact member and the second flat contact member;
- wherein the contact tip of each of the first and second flat contact members has a contact surface having an etched cove along an edge portion forming a blade for inducing scrubbing of a test site during compression of the compliant contact assembly onto the test site.

7. The assembly of claim 6 wherein the blade on the contact tip of the second contact member is positioned opposite the blade on the contact tip of the first contact member.

8. A contact assembly comprising:
- a test socket or probe plate having a plurality of spaced holes positioned therein;
- a compliant contact member having a contact tip positioned within at least a portion of the holes;
- means for biasing the contact member within the holes of the test socket or probe plate; and
- means for inducing a lateral force against an outer diameter side surface of the contact tip to produce a lateral scrubbing movement of an end surface of the contact tip against a test location during biasing of the contact member,
- wherein the compliant contact member shifts laterally within the holes, and
- wherein the means for inducing the lateral force is an angled cam surface on a side of the compliant contact member or the holes of the test socket or probe plate.

9. The contact assembly of claim 8 wherein the means for biasing the contact member is a compression spring adjacent the contact member.

10. The contact assembly of claim 8 wherein the means for biasing the contact member is a plurality of serpentine beams attached to the contact tip.

11. The contact assembly of claim 8 wherein the holes in the test socket or probe plate has a stepped or non-uniform surface.

12. A contact assembly comprising:
- a test socket having a plurality of spaced holes positioned therein, the holes having a stepped or non-uniform diameter along the height of the test socket;
- a compliant contact member having a body portion positioned within the holes and a contact tip extending out of the holes; and
- means for allowing compression of the compliant contact member within the holes;
- wherein the body portion of the compliant contact member has an angled cam surface which physically engages the stepped or non-uniform diameter holes during compression to produce a lateral movement of an end surface of the contact tip against a test site location.

13. The contact assembly of claim 12 wherein the compliant contact member is cylindrical.

14. The contact assembly of claim 13 wherein the test socket comprises a plurality of plates.

15. A method of scrubbing a test site by a compliant contact member comprising the steps of:
- compressing the compliant contact member within a test socket or probe plate by the test site; and
- laterally shifting the compliant contact member to move an end surface of a contact tip on the contact member across a surface of the test site by engaging an outer side surface of the contact member with the test socket or the probe plate along an angled cam surface on either the side surface of the contact member or the test socket or the probe plate.

* * * * *

UNITED STATES PATENT AND TRADEMARK OFFICE
CERTIFICATE OF CORRECTION

| | | |
|---|---|---|
| PATENT NO. | : 8,324,919 B2 | Page 1 of 1 |
| APPLICATION NO. | : 12/629790 | |
| DATED | : December 4, 2012 | |
| INVENTOR(S) | : Scott Chabineau-Lovgren et al. | |

It is certified that error appears in the above-identified patent and that said Letters Patent is hereby corrected as shown below:

In the Claims

Column 6, Claim 4, line 66    Delete "fiat"

Insert -- flat --

Signed and Sealed this
Tenth Day of June, 2014

Michelle K. Lee
*Deputy Director of the United States Patent and Trademark Office*